United States Patent [19]

Ariizumi et al.

[11] Patent Number: 4,737,835
[45] Date of Patent: Apr. 12, 1988

[54] READ ONLY MEMORY SEMICONDUCTOR DEVICE

[75] Inventors: Shoji Ariizumi, Tokyo; Taira Iwase, Kawasaki; Fujio Masuoka, Yokohama, all of Japan

[73] Assignee: Kabushiki Kaisha Toshiba, Kawasaki, Japan

[21] Appl. No.: 919,556

[22] Filed: Oct. 16, 1986

Related U.S. Application Data

[63] Continuation of Ser. No. 603,698, Apr. 25, 1984, abandoned.

[30] Foreign Application Priority Data

Apr. 28, 1983 [JP] Japan .................................. 58-75026

[51] Int. Cl.$^4$ ..................... H01L 29/78; H01L 29/34; H01L 23/48
[52] U.S. Cl. ..................... 357/41; 357/23.9; 357/54; 357/59; 357/71
[58] Field of Search ..................... 357/23.9, 59, 68, 71, 357/23.1, 41, 54

[56] References Cited

U.S. PATENT DOCUMENTS

| | | | |
|---|---|---|---|
| 4,291,322 | 9/1981 | Clemens et al. | 357/59 |
| 4,324,238 | 4/1982 | Chang et al. | 357/23.9 |
| 4,403,394 | 9/1983 | Shepard et al. | 357/59 |
| 4,558,343 | 12/1985 | Ariizumi et al. | 357/59 |
| 4,624,959 | 9/1986 | Nakagawa | 357/41 |
| 4,649,412 | 3/1987 | Iwase et al. | 357/41 |

OTHER PUBLICATIONS

"Late Implant Turns ROMs Around Fast," *Electronics*, May 31, 1983, R. Beresford, pp. 50–51.

*Primary Examiner*—J. Carroll
*Attorney, Agent, or Firm*—Finnegan, Henderson, Farabow, Garrett & Dunner

[57] ABSTRACT

A read only memory contains a conductive layer of polysilicon which contacts the drains of memory cell MOS transistors and lies near and on a gate electrode. A data line made of aluminum and the drain of the MOS transistors are interconnected through the conductive layer. A method of manufacturing the ROM such structure is also disclosed.

3 Claims, 4 Drawing Sheets

F I G. 1
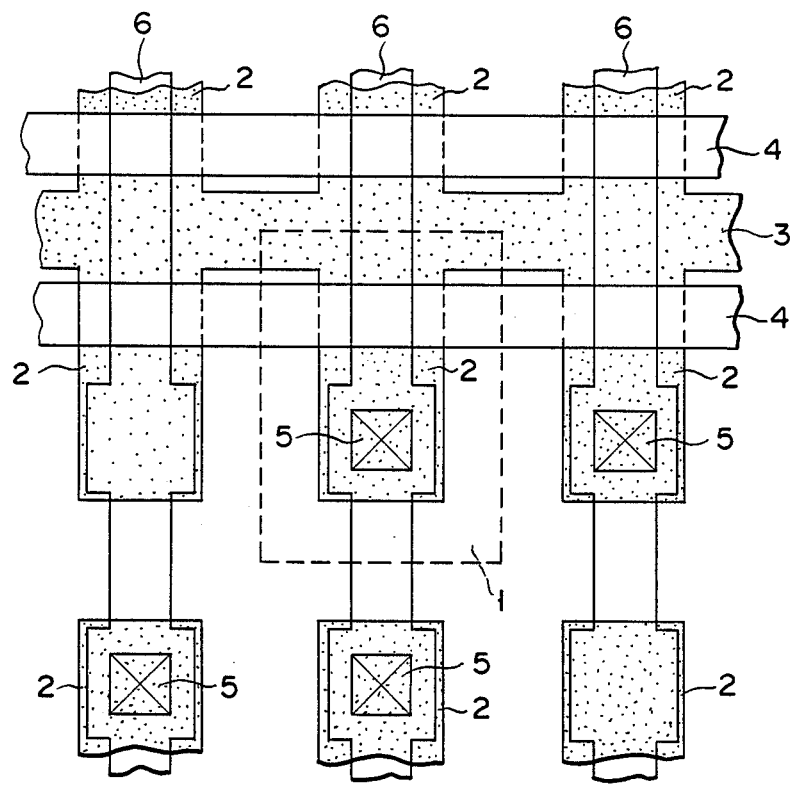
F I G. 2
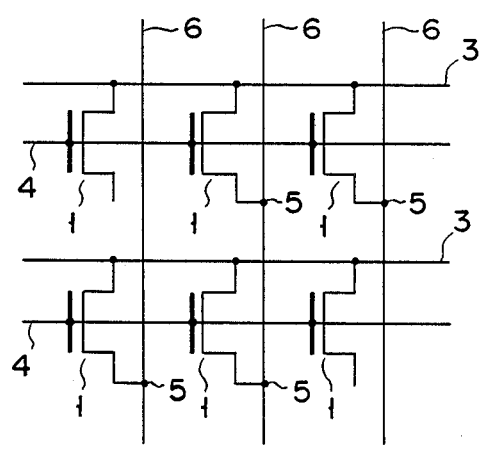

F I G. 3
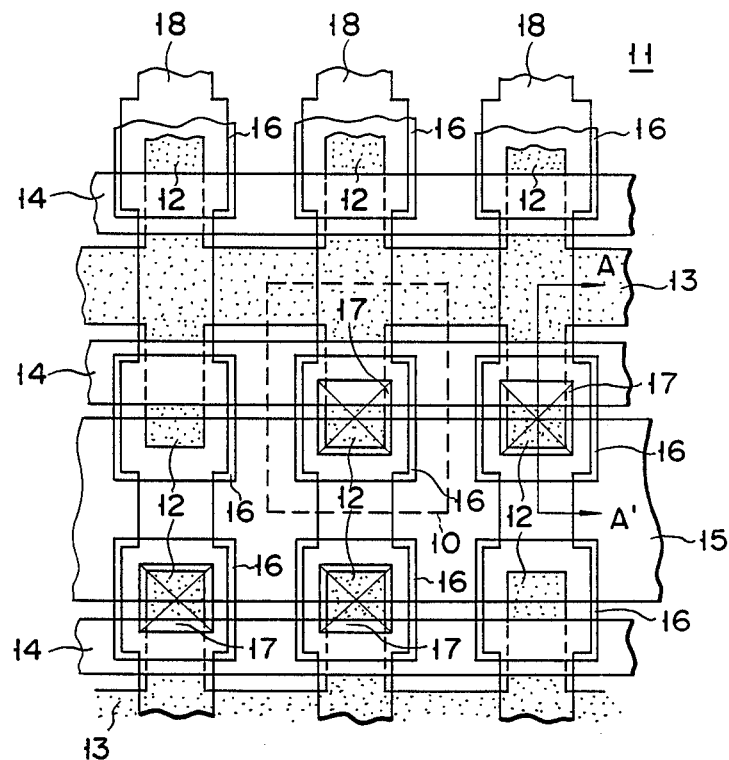
F I G. 4
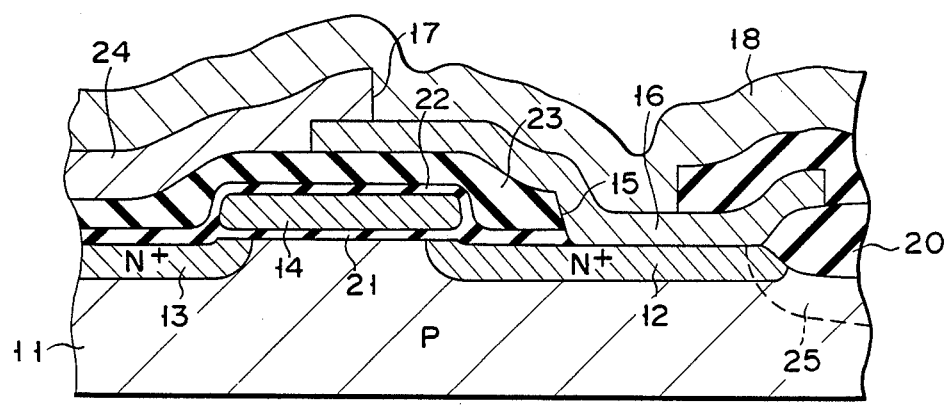

F I G. 5A
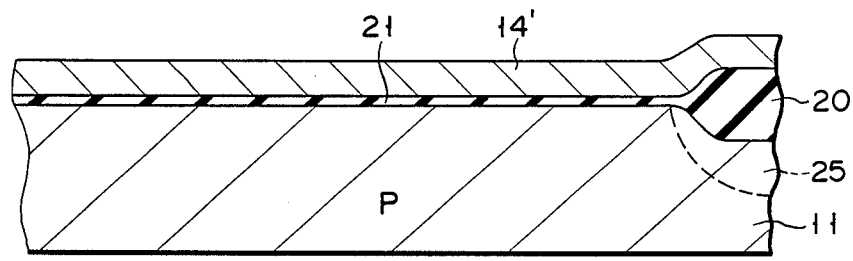
F I G. 5B
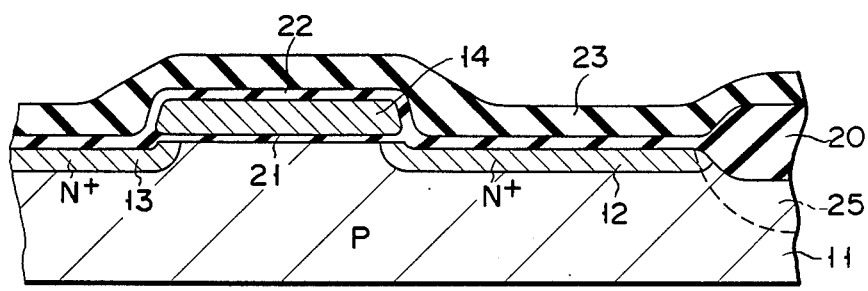
F I G. 5C
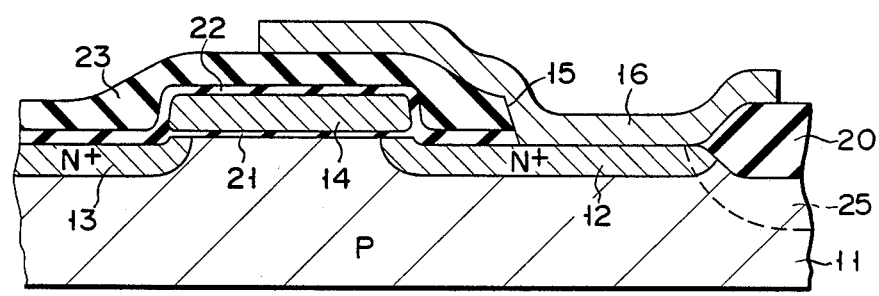

READ ONLY MEMORY SEMICONDUCTOR DEVICE

This application is a continuation of application Ser. No. 603,698, filed Apr. 25, 1984, abandoned.

BACKGROUND OF THE INVENTION

The present invention relates to a read only memory (ROM) semiconductor device of the type in which a contact method is employed for data writing.

In the ROM semiconductor device, to write data, a mask is used during the process of manufacturing the wafer. In this sense, the ROM of this type is called a mask programmable ROM. There have been known several methods to write data into the ROM. One of the data writing methods is a contact method in which data lines selectively contact with specific portions of the semiconductor structure, for example, drain regions of memory cell transistors. Another method is a field oxide programming method in which a transistor or transistors are selectively completed for data writing. A further method is to set the threshold voltage of memory cell transistors at a proper value for data writing.

From a structural viewpoint of the memory cell, the ROM is categorized into a NOR ROM and an NAND-NOR ROM. From an operational viewpoint, the ROM is categorized into a synchronous ROM and an asynchronous ROM. For a high operating speed application, the NOR ROM is employed, while for a low operating speed The data writing method most popularly employed, for the NOR ROM, suitable for a high operating speed application, is the contact method. The contact method is easy and reliable in writing data. In the contact method, the writing process is in the latter half step of the overall ROM manufacturing process and the turn-around time is short.

An example of the prior art ROM pattern based on the contact method is illustrated in FIG. 1 as viewed from the top. In the memory device, memory cells, one of which is typically enclosed by a broken line in FIG. 1, are arrayed in a matrix fashion. Each memory cell is made of a single MOS transistor. The memory cell 1 is structurally composed of a single crystal silicon region 2 doped with an impurity serving as the drain of each of MOS transistors, a diffusion region 3, word lines 4 made of polysilicon, and data lines 6. The diffusion region 3 serves as the source common to the MOS transistors in a row direction of the matrix array. Each word line 4 extends horizontally and forms the gate electrode common to those MOS transistors arranged in a row direction. The data lines 6 are vertically arranged and are selectively connected to the drains of the MOS transistors through contact holes 5.

The ROM thus structured may electrically be expressed as shown in FIG. 2. In the ROM, the connection or nonconnection of the drains of the MOS transistors through the contact holes to the data lines 6 respectively provide logical "1" or "0".

The ROM with the pattern as shown in FIG. 1 has the physical contacts of the silicon region 2 with the data lines 6 via the contact holes 5. The data line 6 is made of aluminum. For securing a good contact, a minimum contact resistance is required at the interface between the data line 6 and the silicon region 2. By the way, the work function of silicon is different from that of aluminum. Contact resistance when materials with different large. A simple and effective measure to reduce, contact resistance between the region 2 and the data line 6 is to enlarge an area of the contact holes 5 and a contact area between the region 2 with the data line 6. Further, to prevent an erroneous contact between the data line 6 and the semiconductor substrate, it is required that the diffusion region 2 is much larger than the size of the contact holes 5. Therefore, an area occupied by each memory cell is large, imparing an integration density. These facts become problematic particularly in large capacity ROMs.

SUMMARY OF THE INVENTION

Accordingly, an object of the present invention is to provide a ROM semiconductor device with small memory cell areas and using the contact method for data writing.

Another object of the present invention is to provide a method for manufacturing such ROMs.

According to the invention, there is provided a read only memory semiconductor device comprising:

a pair of regions of a first conductivity type formed in a semiconductor substrate of a second conductivity type opposite to said first conductivity type, the pair of regions individually forming drain and source regions of a MOS transistor;

a first insulation film for gate insulation formed on said substrate;

a first conductive layer for a gate electrode formed on said gate insulation film;

a second insulation film formed on said gate electrode;

a second conductive layer containing an impurity of said first conductivity formed on one of said pair of regions, the second conductivity layer extending onto said second insulation film which is on said gate electrode; and a third conductive layer formed on said second conductive layer.

According to the invention, there is further provided a method of manufacturing a read only memory semiconductor device comprising the steps of:

forming a field insulation region in a semiconductor substrate of a first conductivity type to form a region for an element isolated from other region of the substrate;

forming a first insulation film for gate insulation on the element region;

forming a first conductive layer for gate electrode on said gate insulation film;

doping an impurity of a second conductivity type opposite to said first conductivity type into said element region, using as a mask said field insulation region and gate electrode to form a pair of semiconductor regions of said second conductivity type;

forming a second insulation film on the entire major surface of the semiconductor structure;

forming a contact hole, in said second insulation film, leading to one of said pair of semiconductor regions;

forming a second conductive layer of an impurity of said second conductivity type with a predetermined pattern on the entire major surface of the semiconductor structure, the second conductive layer contacting said one of the pair of semiconductor region and extending onto that part of said second insulation film which is on said gate electrode;

forming a third insulation film on the entire major surface of the semiconductor structure;

forming a contact hole, in said third insulation film, leading to said second conductive layer according to the information to be stored; and forming a third conductive layer with a predetermined pattern on the entire major surface of semiconductor structure.

BRIEF DESCRIPTION OF THE DRAWINGS

FIG. 1 is a plan view of a prior ROM based on the contact method;

FIG. 2 illustrates the equivalent circuit of the ROM shown in FIG. 1;

FIG. 3 is a plan view of an embodiment of a ROM according to the present invention;

FIG. 4 is a cross sectional view taken on line A—A' in FIG. 3;

FIGS. 5A-5D are a series of cross sectional views illustrating a sequence of the process steps for manufacturing the ROM according to the present invention.

DETAILED DESCRIPTION OF THE PREFERRED EMBODIMENTS

Figure 5D:
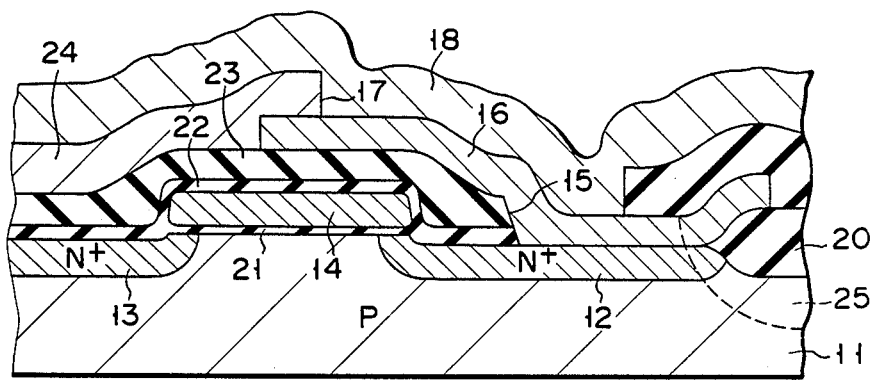

A first embodiment of the present invention will be described referring to FIGS. 3 and 4. FIG. 3 illustrates a pattern of a part of a matrix array of N-channel MOS transistors, which corresponds to the pattern of the ROM shown in FIG. 1. A partial cross sectional configuration of the ROM of FIG. 3 is illustrated in FIG. 4.

In the memory device, each memory cell 10 is as enclosed by a broken line. Those memory cells 10 are arrayed in a matrix fashion. Formed in the surface region of the semiconductor substrate 11 of a P conductivity type are regions 12 of an N+ conductivity type, which serve as drains of the memory cells 10. Further formed in the surface region of the semiconductor substrate 11 is a laterally extending region 13 of an N+ conductivity type, which serves as a source common to the memory cells arrayed in a row direction of the matrix array in FIG. 3. Word lines or gate electrodes 14 (first conductive layers) extend horizontally in a region or a gate region between the N+ region 12 and 13 as the source and the drain of each of the memory cells arrayed in the row direction. Thus, each word line serves as a common gate electrode to the memory cells 10 arranged in the row direction, and is made of polysilicon. The drain regions 12 of the memory cell transistors, which are selected according to the data to be written, are physically in contact with a second conductive layer 16 or a first interconnection layer through contact holes 15 each formed for two adjacent rows of memory cells. The second conductive layer 16 is made of polysilicon. The second conductive layer 16 extends over the word line 14 as the common gate electrode. The data lines 18 are each formed for a series of memory cells 10 arrayed in a column direction, while contacting the drains of the memory cells selected according to the data to be written through the contact holes 17.

In FIG. 4 illustrating a cross section taken on line A—A' in FIG. 3, reference numeral 20 designates a field oxidation film for separating elements. A gate insulation film 21 lies under the word line 14. Reference numerals 22-24 designate oxidation films. A layer 25 lying under the field oxidation film 20 is for preventing the formation of a parasitic inversion layer.

As shown, the field oxidation film 20 separates the adjacent regions in the P type substrate 11 where elements, i.e., the N+ regions 12 and 13, are individually formed. The insulation film 21 with a predetermined pattern is formed in the region between the N+ regions 12 and 13 in the surface region of the substrate 11, while partially overlapping at both sides with those N+ regions 12 and 13. The gate electrode or the word line 14 is formed over the insulation film 21 thus formed. Additional insulation films 22 and 23 are successively layered over the insulation film 21. The gate electrode 14 is directly enclosed by the insulating layers 21 and 22. The second polysilicon layer or interconnection layer 16 lies over and contacts the N+ region 12 as the drain in the contact hole 15, and extends onto the insulation layer 23 under which the gate electrode 14 lies. That is, the extended portion of the second polysilicon layer 16 overlaps with the gate electrode 14. Further, the second conductive or interconnection layer 16 partially extends over the field oxidation film 20. Another insulation film 24, having a predetermined pattern and a contact hole 17, overlays the insulation film 23 with a predetermined pattern and partially covers the interconnection layer 16. A third conductive or interconnection layer 18 made of aluminium is formed over the entire surface of the semiconductor structure having the uppermost film 24. The third interconnection layer 18 contacts the second interconnection layer 16 through the hole 17.

In the structure of the semiconductor memory device, it is to be noted that the N+ region 12 as the drain is not directly in contact with the data line 18 made of aluminum of which the work function is different from that of the region 12, but contacts the second interconnection 16 made of polysilicon with the work function equal to that of the N+ region 12 per se. This structural feature indicates that a contact area of sufficiently low resistivity can be obtained even if the contact area between the N+ region 12 and the second conductive layer 16 is small, and that the diameter of the contact hole can be shortened enough to satisfy a design requirement of the MOS memory device. It is further noted that the second conductive layer 16 is self-aligned on the field insulation film 20. This feature allows an area of the N+ region 12 to be made sufficiently small during manufacturing. Because of this feature, the size of one memory cell is reduced 20-50% as compared with the conventional one.

The data line 18 made of aluminum is directly in contact with the second conductive layer 16 made of polysilicon of which the work function is different from that of the data line 18. However, the second conductive layer 16 extends over the gate electrode 14 and the area for contact pad is enough greater than that of the N+ region 12. Accordingly, a contact area of the data line 18 and the second conductive layer 16 can be enlarged irrespective of the size of the N+ region 12. If so, contact resistance between the data line 18 and the second conductive layer 16 can be reduced satisfactorily, thereby providing a smooth signal flow therebetween. The low contact resistance also provides a satisfactory voltage-current characteristic, thereby realizing a high density integration.

In the ROM of this embodiment, memory cells of 1 Mega bits or more could be integrated into a single chip. As recalled, the data line 18 and the N+ region 12 are not in contact with each other. Therefore, the short of the PN junction between the substrate 11 and the N+ region 12 can be prevented.

A manufacturing method of the MOS as mentioned above will be given referring to FIGS. 5A to 5D.

(1) FIG. 5A

To start, a P type silicon substrate 11 of 1 to 100 Ωcm in resistivity is prepared. An impurity of the same conductivity type as that of the substrate 11 is doped by the ion implantation into a region in the substrate 11 which will serve as a field region. Then, a field oxidation film 20 for separating the element regions from one another is formed to a thickness of approximately 6,000 Å by the selective oxidation technique. A gate insulation film 21 of approximately 500 Å in thickness is formed on the element region by the dry oxidation or the hydrochloride oxidation technique. A polysilicon layer 14' (or conductive layer) is formed to about 4,000 Å in thickness over the entire surface of the gate insulation film 21 by the vapor phase growing process. The polysilicon layer 14' contains P-type or N-type impurity, and therefore is in low resistance. In this process step, a layer 25 for preventing the formation of a parasitic layer is formed underlying the field insulation film 20.

(2) FIG. 5B.

The polysilicon layer 14' is patterned by the PEP (the photoengraving process), to form word lines 14 as gate electrodes. Using the word line 14 and the field insulation film 20 as a mask, arsenide (As) is diffused up to $10^{20}$ to $10^{21}$/cm$^3$ in a surface concentration. Alternately, arsenide is ion-implanted with a dose of about $10^{15}$ to $10^{16}$ cm$^{-2}$. Through this process, N+ regions 12 and 13 are formed, which are respectively used as the source and drain of a MOS transistor. The semiconductor structure thus fabricated is again subjected to a dry oxidation at about 1,000° C., thereby to form a silicon oxide film 22 over the entire surface of the element region. By the CVD (chemical vapor deposition) process, an oxide film 23 (low temperature oxide film) is formed up to a thickness of approximately 2,000 to 3,000 Å in a low temperature condition, laying over the entire surface of the semiconductor structure. In this process step, word lines, i.e., gate electrode layers 14, are formed in the region between the N+ regions 12 and 13 of the substrate 11.

(3) FIG. 5C

The PEP technique is employed again to selectively remove the oxidation film 23 and the silicon oxidation film 22, and to form contact holes 15 at predetermined locations which open to expose the N+ region 12. A second polysilicon layer or conductive layer is grown on the entire surface of the semiconductor structure by the vapor phase growing process. The polysilicon layer formed is patterned by the PEP process to have a desired polysilicon layer 16. The polysilicon layer 16 may be a polysilicon layer doped with phosphorous (P) or arsonic (As). Alternatively, a polysilicon layer undoped with impurity is first formed and then doped with arsenide by the implantation process.

(4) FIG. 5D

At the final stage of this process, a low temperature oxidation film 24 of approximately 10,000 Å in thickness is deposited on the entire surface of the semiconductor structure by the CVD process. Then, a contact hole 17 allowing the conductive layer 16 to be exposed is formed. An aluminum layer is deposited by the vacuum deposition process on the entire surface of the semiconductor structure. The aluminum layer is subjected to a patterning by the PEP technique to thereby form a data line 18 of a predetermined pattern. Finally, the semiconductor structure is covered with a protective film (not shown). At this point, the semiconductor memory device is completed.

In the above-mentioned manufacturing method, through the heat treatment following the formation of the conductive layer 16, any impurity contained in the conductive layer 16 is diffused into the region in the vicinity of the interface between N+ region 12 and the field oxidation film 20. That is, the N+ region is formed in a substantial self-aligning manner. With the self-alignment of the N+ region, even if the substrate 11 is partially exposed at the time of forming the contact hole 15, the second conductive layer 16 and the substrate 11 are not shortcircuited.

Figure 6:
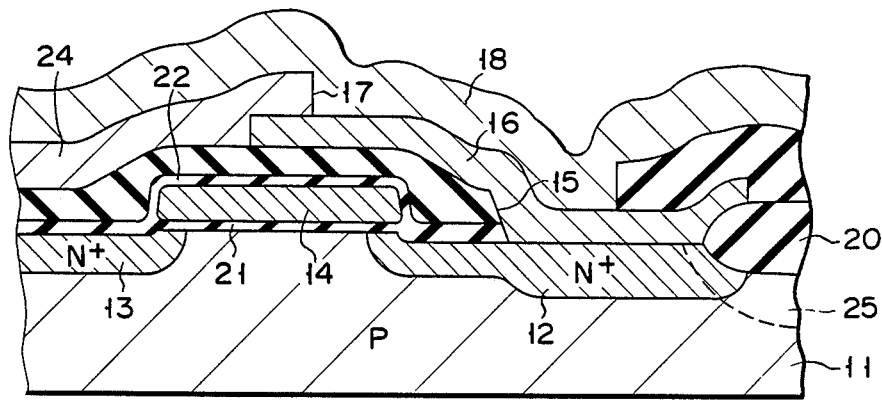
FIG. 6 is a cross sectional view of another embodiment of a ROM according to the present invention, which corresponds to the cross section of FIG. 4.

FIG. 6 shows a cross sectional structure of another embodiment of a MOS according to the present invention. This illustrated structure corresponds to that of FIG. 4 in the first embodiment. Like numerals are used for simplicity to designate like or equivalent portions in FIG. 4. A feature of this embodiment lies in a configuration of the N+ region 12 having a nonuniform thickness. Specifically, the thickness of the portion of the N+ region 12 underlying the contact hole 15 is thicker than that of the remaining portion. To have such a configuration of the N+ region 12, an undoped polysilicon layer is deposited over the entire surface of the semiconductor structure in the process step for forming the conductive layer 16. Then, phosphorous is diffused into the region 12. Alternately, the region is doped with phosphrous. After this, a predetermined patterning is applied to the conductive layer 16. In this process, the heat treatment following the formation of the conductive layer 16 implants a larger amount of impurity from the conductive layer 16 into the N+ region 12, when compared with that of the first embodiment. Therefore, the N+ region 12 is grown to have a greater thickness.

Of course, the present invention is not limited to the above specific embodiments. For example, the polysilicon layer for the word line 14 may be replaced by a layer made of high melting point silicide, such as molybdenum silicide (MoSi$_2$), a layer of high melting point metal, such as molybdenum (Mo), or a combination of the polysilicon layer and either of the latter two layers. The conductive layer 16 may be a high melting point silicide film.

Further, material for the conductive layer 16 may be any conductive material which may contain impurities, for example, high melting point silicide.

As mentioned above, in the above-mentioned embodiments, the substrate material is of P type and the memory cells in the ROM are N channel MOS transistors. Alternatively, the substrate material may be of P type and the memory cells may be N well complementary MOS transistors. Additionally, the substrate material may be of N type and the memory cells may be P well complementary MOS transistors with the P wells formed in the substrate. Thus, it should be understood that the present invention may be variously changed and modified within the scope of the present invention.

As seen from the foregoing description, the present invention provides a ROM based on the contact method which has a reduced area for each memory cell and an improved integration density, and a method of manufacturing the ROM.

What is claimed is:

1. A read only memory semiconductor device comprising:

a pair of regions of a first conductivity type formed in a semiconductor substrate of a second conductivity type opposite to said first conductivity type, the pair of regions individually forming drain and source regions of an MOS transistor;

a first gate insulation film formed on said substrate;

a first gate electrode conductive layer formed on said gate insulation film;

a second insulation film formed on said gate electrode conductive layer;

a second conductive layer of said first conductivity type formed on one region of said pair of regions, the second conductive layer extending through said second insulation film;

a third insulation film formed on said second conductive layer and having a contact hole, the contact hole being partially above said one region; and a third conductive layer formed on said third insulation film, the third conductive layer extending into said contact hole and contacting said second conductive layer, a continuous portion of the third conductive layer being above said one region.

2. A semiconductor device according to claim 1, wherein said second conductive layer is formed of polysilicon.

3. A semiconductor device according to claim 1, wherein said one of the pair of semiconductor regions has a thicker part thereof which contacts said second conductive layer.

* * * * *